United States Patent [11] 3,615,567

[72] Inventor Howard Ivan Wilson
Towanda, Pa.
[21] Appl. No. 852,158
[22] Filed Aug. 20, 1969
[45] Patented Oct. 26, 1971
[73] Assignee E. I. du Pont de Nemours and Company
Wilmington, Del.

[54] PHOTOSENSITIVE ELEMENTS CONTAINING INORGANIC HALIDE IMAGE INTENSIFIERS
8 Claims, No Drawings

[52] U.S. Cl. .......... 96/90 R, 96/115 R, 96/115 P
[51] Int. Cl. .......... G03c 1/70
[50] Field of Search .......... 96/115, 115 P, 90

[56] References Cited
UNITED STATES PATENTS

| | | | |
|---|---|---|---|
| 3,479,185 | 11/1969 | Chambers | 96/84 |
| 3,390,995 | 7/1968 | Manos | 96/48 |
| 3,390,996 | 7/1968 | MacLachlan | 96/48 |
| 3,445,233 | 5/1969 | Cescon | 96/90 |

FOREIGN PATENTS

| | | | |
|---|---|---|---|
| 1,481,819 | 4/1967 | France | 96/115 |

*Primary Examiner*—Ronald H. Smith
*Attorney*—Lynn Barratt Morris

ABSTRACT: A light-hardenable element comprising a preformed, compatible, coherent, film-forming macromolecular organic polymer, a free radical-producing hydrogen donor agent, an imidazolyl dimer and, optionally, a macromolecular organic polymer protective layer; and in intimate association therewith, a halide selected from the group consisting of ammonium, barium, calcium, magnesium aluminum, mercuric, zinc, cobaltous, cuprous, and ferric chlorides; magnesium bromide and aluminum iodide are capable of producing enhanced visible images upon photolysis.

PHOTOSENSITIVE ELEMENTS CONTAINING INORGANIC HALIDE IMAGE INTENSIFIERS

BACKGROUND OF THE INVENTION

This invention relates to photopolymerizable compositions, elements and processes. More particularly it relates to a novel product for obtaining intensified visual images upon photolysis of a photopolymerizable stratum.

Photopolymerizable compositions and elements as described in assignee's applications, Chambers, Ser. No. 688,703 filed Dec. 7, 1967, now U.S. Pat. No. 3,479,185; and, Chang and Fan, Ser. No. 731,733 filed May 24, 1968 and the patents set out therein, are useful in the preparation of photopolymer relief images. These compositions contain, inter alia, addition polymerizable ethylenically unsaturated compounds, e.g., vinylidene and vinyl polymers, preferably of acrylic or alkacrylic esters and an addition polymerization initiator activatable by actinic radiation. The photopolymerizable element is exposed imagewise, e.g., through a separate light stencil, or photographic image bearing process transparency, to actinic radiation, which causes the ethylenically unsaturated compound to photopolymerize and become substantially insoluble in the exposed areas. After exposure, the elements are developed by suitable means, e.g., solvent washout, thermal transfer, pressure transfer, dusting of pigments, differential adhesion of an exposed vs. an underexposed area, etc. to produce an image on a receptor or a relief suitable for printing.

In most applications, it is desirable to be able to tell whether the plate has been exposed, prior to the processing procedure. If no indication is available as to whether or not a plate has been exposed, it is possible to double expose a plate, or to process an unexposed plate. In other applications, the intensity of the exposure source varies with respect to the photopolymer plate being exposed. In these cases, the duration of the exposure has to be altered to compensate for the changed light intensity. In all of these cases, it would be ideal to have a plate which produces a visible image with the intensity of this image being proportional to the exposure.

SUMMARY OF THE INVENTION

An object of this invention is to provide an intensified visible image in a photopolymerizable stratum. A further object is to provide such an image upon exposure, and prior to processing.

The photosensitive elements of this invention comprise a support bearing, in order 1. photosensitive stratum comprising:
   a. a preformed compatible coherent film-forming macromolecular organic polymer having a molecular weight greater than 10,000 and being solid at 50° C;
   b. a free radical-producing hydrogen donor agent;
   c. a 2,4,5-triphenylimidazolyl dimer consisting of two lophine radicals bound together by a single covalent bond; and optionally,
   d. at least one nongaseous ethylenically unsaturated compound capable of forming a high polymer by free radical initiated, chain propagating, addition polymerization; and optionally,
2. A protective layer of a macromolecular film-forming organic polymer, the elements being characterized by having in or in contact with the stratum at least one halide selected from the group consisting of ammonium, barium, calcium, magnesium, aluminum, mercuric, zinc, cobaltous, cuprous, and ferric chlorides; magnesium bromide and aluminum iodide. They are capable of producing enhanced visible images upon photolysis. Upon such exposure and photolysis, the photosensitive stratum yields an intense visible image.

PREFERRED EMBODIMENTS

The metallic halide used in the preferred embodiment of this invention is calcium chloride. It is generally used in the dihydrate form. Other suitable metallic chlorides that will function in the processes of this invention are mercuric chloride, aluminum chloride, zinc chloride, cobaltous chloride, and ammonium chloride.

A further group of halide compounds which are useful in the processes of this invention includes aluminum iodide, magnesium bromide, magnesium chloride, barium chloride, and cuprous chloride.

The amount of halide compound which is employed will vary depending on many factors, e.g., the particular metallic halide used, the composition of the photopolymer stratum and the desired intensity of the image. Generally, however, 1 percent to 2 percent by weight of solids is a desirable amount.

The coating compositions onto which the halide compounds are introduced contain a thermoplastic macromolecular organic polymer binder, e.g., cellulose acetate, cellulose acetate butyrate, polymethyl methacrylate, methyl methacrylate copolymerized with methacrylic acid, etc. Other useful binders are disclosed in Colgrove U.S. Pat. No. 3,353,955.

Besides these binders other components are advantageously included in the imaging formulation, such as initiators, solvents, sensitizers, or plasticizers.

Useful sensitizers include the xanthenes and coumarin disclosed in assignee's Chambers application, Ser. No. 688,703 filed Dec. 7, 1967.

A wide range of nonpolymerizable plasticizers are effective in achieving improved exposure and development temperature latitude. See Chang et al. U.S. Ser. No. 731,733 filed May 24, 1968 for useful specific plasticizers. It should be noted however, that the intensified images of this invention can be obtained without the necessity of having a plasticizer in the imaging composition.

To the binder in a suitable solvent can be added a monomer which is ethylenically unsaturated and suitable for free radical-initiated, chain-propagating addition polymerization, e.g., pentaerythritol triacrylate, polyethylene glycol diacrylate, triethylene glycol diacrylate, polyethylene glycol dimethacrylates, polymethylene diacrylate and dimethacrylate, trimethylolpropane triacrylate and trimethacrylate. These monomers have at least two terminal ethylenic groups.

The addition polymerizable polymers disclosed in U.S. Pat. Nos. to Schoenthaler, 3,418,295, Dec. 24, 1968, and Celeste, 3,448,089, June 3, 1969, can be used in lieu of or in combination with the monomer binder systems.

Preferred free radical-producing hydrogen donor agents are organic amines, or mercaptans and others, as listed in assignee's Chambers application, Ser. No. 688,703, filed Dec. 7, 1967, can be used as constituent B.

Preferred initiators are lophine dimers (2,4,5-triphenylimidazolyl dimers), consisting of two lophine radicals bound together by a single covalent bond, e.g., 2(o-chlorophenyl)-4,5 diphenyl-imidazolyl dimer, and others described in assignee's Chang et al., U.S. Ser. No. 731,733 filed May 24, 1968 and British Pat. specification 997,396 published July 7, 1965, and 1,047,569 published Nov. 9, 1966, also assignee's Chambers U.S. application, Ser. No. 688,703 filed Dec. 7, 1967.

In addition, the photopolymerizable composition and layers may contain a colorant and/or color producing agent. Useful colorants include the dyes and pigments described in assignee's Burg et al. U.S. Pat. No. 3,060,023. Suitable color amine-substituted leuco dyes can function both in the role of a color forming agent and a free radical generating agent. Especially useful leuco dyes have at least one dialkylamino group. Also, any amine substituted leuco triphenylmethane dye or various salts of the dye, e.g., the hydrochloride of the leuco blue dye can be used. Suitable leuco dyes and their salts are disclosed in Chang et al. U.S. Ser. No. 731,733 filed May 24, 1968.

The photopolymerizable stratum can be provided with a layer of polyvinyl alcohol or gelatin, as described in assignee's Alles U.S. Ser. No. 560,899, filed June 27, 1966, now abandoned, or some other macromolecular organic polymer binder having film-forming properties, especially a water-permeable organic colloid.

The halide compounds of this invention may be added at any convenient stage in the preparation of the photopolymerizable layer, or they may be present in the protective layer.

After coating on a suitable support the photopolymerization element is dried and exposed in the normal manner as is well known in the art. After exposure an intense image is visible on the photopolymer plate.

Development of the exposed film element may be accomplished by solvent washout. Development produces a relief or an image, useful as a printing plate or a resist.

Typical inert supports suitable for coating the photopolymerizable compositions of this invention include materials such as films of plastics, e.g., polymeric materials such as regenerated cellulose, cellulose acetate, cellulose nitrate, polyesters of glycols and terephthalic acid, vinyl polymers and copolymers, polyethylene, polyvinyl acetate, polymethyl methacrylate, polyvinylchloride, glass, wood and metals.

By varying the duration and intensity of the exposure or the quantity of the halide compound, the intensity of the visible image can be varied, thus providing the operator with some indication as to whether a plate has been exposed, and if so the relative degree of exposure.

The invention will be further illustrated by the following examples, however, the scope of the invention is not intended to be limited thereby.

EXAMPLE I

The following photopolymerizable composition was prepared.

2-Ethoxyethanol—3200 ml.
Methyl methacrylate/methacrylic acid copolymer—1000 gms.
2(o-Chlorophenyl) 4,5 dimethoxy-phenylimidazolyl dimer—37.4 gms.
Tris(p-diethylamino-o-tolyl)methane—30.0 gms.
Bis-dimethylaminobenzophenone—20.0 gms.
C.I. solvent red 109—20.0 gms.
Mixed ester of triethylene glycol dicaprate and dicaprylate—120.0 gms.

The above was stirred for three hours and then there was added,

Calcium chloride dihydrate (Fisher C–79)—25.6 gms.

After stirring for 15 minutes (note that the calcium chloride does not completely dissolve), there was added:

Trimethylolpropane triacrylate—380.0 gms.

After stirring for 15 minutes, the mixture was filtered and the filtrate discarded.

This composition was coated on a grained aluminum plate and dried. A second plate was coated with the above composition, but without the treatment with the calcium chloride. A third plate was coated with the above composition, but without the trimethylolpropane triacrylate. A fourth plate as coated in a similar fashion but without C.I. 109 Solvent Red, a fifth plate was so coated, but without the alkyl acid esters of triethylene glycol, and a sixth plate was so coated but without the bis-dimethylaminobenzophenone.

The photopolymerizable layer was coated with the following composition:

| | |
|---|---|
| Deionized Water | 920 g. |
| Polyvinyl Pyrrolidone | 135 g. |
| Polyvinyl Alcohol | 9 g. |
| 2-Ethoxyethanol | 5 ml. |
| Ethanol | 5 ml. |
| Surfactant (Ethylene Oxide Condensate of Nonyl Phenol) | 1.5 ml. |

The dried plates were exposed through a negative ($21\sqrt{2}$ step Graphic Arts Technical Foundation exposure wedge) in a vacuum frame with a carbon arc (B-1C constantarc 140 ampere No. 1112 - Ld-612 Macbeth Arc Lamp Co., Phila., Pa.) at a distance of 56 inches for 35 seconds.

An excellent deep blue visible image is obtained upon exposure in all plates containing calcium chloride. The untreated plate had only a faint visible image.

These plates were then developed by washing out the unexposed areas in a solution as described in example I of assignee's Chang et al. application, Ser. No. 731,733 filed March 24, 1968.

Reliefs suitable for lithographic printing were obtained in all plates except the third.

EXAMPLE II

A photopolymerizable composition was prepared and coated as in example I except that no calcium chloride was used.

A liter of 2-ethoxyethanol was placed on a magnetic stirrer and 20.0 grams of $CaCl_2 \cdot 2H_2O$ was added. After stirring for 20 minutes, the calcium chloride was dissolved. This chloride solution (40 cc.) was added to 100 cc. of the overcoat composition prepared as in example I. The composition was coated on the photopolymerizable layer and dried.

A second photopolymer plate was similarly prepared and overcoated except that the overcoat did not contain calcium chloride.

After drying both plates were exposed as in example I. The plate bearing the calcium chloride treated overcoat yielded an intense blue image upon exposure, the plate bearing the coating without calcium chloride gave only a faint image.

Upon development by washing out, as in example I both plates provided reliefs suitable for lithographic printing. Similar results were obtained with 20 cc. chloride solution.

EXAMPLE III

Four plates were prepared as in example II except that mercuric chloride, zinc chloride, aluminum chloride (aluminum chlorhydrol), and cobaltous chloride were used in the overcoat layers instead of calcium chloride, but in similar amounts.

After drying, the plates were exposed as in example II. Upon exposure, all four plates yielded intense visible blue images.

These plates were developed by washing out as in example II, and all provided reliefs suitable for lithographic printing.

EXAMPLE IV

Three photopolymer plates were prepared as in example II except that the amount of calcium chloride was varied in each sample.

Sample A used 2 percent (20 g. of $CaCl_2$/liter of 2-ethoxyethanol).

Sample B used 1.5 percent (20 g. of $CaCl_2$/liter of 2-ethoxyethanol).

Sample C used 1 percent (20 g. of $CaCl_2$/liter of 2-ethoxyethanol).

All samples were exposed as in example III. Upon exposure, the plates yielded visible blue images. The intensity of the image being greater in the plates having the larger amounts of calcium chloride.

EXAMPLE V

The following photopolymerizable coating composition was prepared.

| | |
|---|---|
| Trimethylolpropane Triacrylate | 26.4 g. |
| Triethylene Glycol Diacrylate | 8.2 g. |
| Polymethylmethacrylate (Inherent Viscosity 1.20) | 17.2 g. |
| Polymethylmethacrylate (Inherent Viscosity 0.20) | 41.2 g. |
| 7-Diethylamino-4-Methyl-Coumarin | 1.12 g. |
| 2-(o-Chlorophenyl)-4,5-dimethoxyphenylimidazolyl dimer | 5.68 g. |
| 2-Mercaptobenzimidazole | 0.178 g. |
| Victoria Pure Blue BO Dye | 10 ml. |

This composition was coated on a 0.004-inch polyethylene terephthalate sheet to a thickness of 0.001 inches, and allowed to dry, and then heat-laminated to a 0.004 inches copper plate. The polyethylene terephthalate was then stripped off. The photopolymerizable layer was coated with a calcium chloride-containing composition as in example II, and allowed to dry.

The element was exposed through a negative printed circuit transparency approximately 24 inch from carbon arc tungsten lamp for 180 seconds. Upon exposure an intense visible image was apparent.

The element was processed in methyl chloroform to yield a relief suitable as a photoresist.

The following compositions were prepared in separate containers.

A

| | |
|---|---|
| Gelatin | 18 g. |
| Polyacrylamide | 0.25 g. |
| Mixture of Mono and Diesters of Phosphoric Acid with Ethylene Oxide Condensate of Nonyl Phenol | 0.5 g. |
| Dalamar Yellow (22 %) | 1.5 g. |
| Water | 300 g. |

B

| | |
|---|---|
| Trimethylolpropane Triacrylate | 15 g. |
| Mixed Ester of Triethylene Glycol Dicaprate and Dicaprylate | 5 g. |
| 2-(o-Chlorophenyl)-4,5 Dimethoxyphenylimidazolyl Dimer | 2.2 g. |
| Tris (p-diethylamino-o-tolyl) Methane | 1.0 g. |
| Leuco Crystal Violet | 0.8 g. |
| Trichloroethylene | 25 ml. |

The aqueous and organic phases were mixed, divided into four equal parts and blended for 15 minutes in the kinetic dispersion mill.

The emulsion was then skim coated at 90° F. (10 feet per minute) to an unsubbed 0.004 inches thick polyethylene terephthalate base. The dried photopolymer was 0.44 inch thick. The dried photopolymer element was overcoated with a calcium chloride containing layer as described in example II. A second sample was similarly coated with the exception that no calcium chloride was present.

The dried element was exposed to an inverted gravure halftone positive step wedge for 2 minutes to a carbon arc as in example I.

Upon exposure, the element bearing the calcium chloride containing overcoat yielded an intense visible image, while the sample bearing the overcoat without calcium chloride gave only a faint visible image.

EXAMPLE VI

Five samples were prepared as in example I, with the exception of the overcoat, which was eliminated.

These samples were exposed as in example I. Upon exposure all the plates containing calcium chloride yielded an intense deep blue color.

The embodiments of the invention in which an exclusive property or privilege is claimed are defined as follows:

1. A photosensitive element comprising a support bearing a photosensitive stratum comprising
   a. a preformed, compatible coherent film-forming macromolecular organic polymer having a molecular weight greater than 10,000 and being solid at 50° C.;
   b. a free radical-producing hydrogen donor agent; and
   c. a 2,4,5-triphenylimidazolyl dimer consisting of two lophine radicals bound together by a single covalent bond;

said element being characterized by having in or in contact with the stratum at least one halide selected from the group consisting of ammonium, barium, calcium, magnesium, mercuric, zinc, cobaltous, cuprous and ferric chloride; magnesium bromide and aluminum iodide.

2. An element according to claim 1, having in contact with the outer surface of said stratum a protective layer of a macromolecular, film-forming organic polymer.

3. An element according to claim 1, wherein said halide is in the stratum.

4. An element according to claim 1, having in contact with the outer surface of the stratum a protective layer of a water-permeable protective colloid.

5. An element according to claim 1, wherein said halide is in a protective layer of a macromolecular, film-forming organic polymer on said stratum.

6. An element according to claim 1, wherein said photosensitive layer is addition photopolymerizable and further comprises
   d. at least one nongaseous, ethylenically unsaturated compound capable of forming a high polymer by free radical initiated, chain propagating, addition polymerization.

7. An element according to claim 6, wherein said halide is calcium chloride, and it is in the photopolymerizable stratum.

8. An element according to claim 6, wherein the unsaturated compound is trimethylolpropane triacrylate.